United States Patent [19] [11] 4,425,791
Kling [45] Jan. 17, 1984

[54] COMPUTER BASED ENGINE ANALYZER WITH HARDWARE CYLINDER COUNTER

[75] Inventor: Michael J. Kling, Mequon, Wis.

[73] Assignee: Bear Automotive Service Equipment Company, Milwaukee, Wis.

[21] Appl. No.: 330,151

[22] Filed: Dec. 14, 1981

[51] Int. Cl.³ .......................................... G01M 15/00
[52] U.S. Cl. ................................................ 73/117.3
[58] Field of Search .............. 73/117.3, 116; 324/392, 324/402; 364/551

[56] References Cited

U.S. PATENT DOCUMENTS

| | | | |
|---|---|---|---|
| 3,572,103 | 3/1971 | Marino | 73/116 |
| 4,006,403 | 2/1977 | Olsen et al. | 73/116 X |
| 4,050,296 | 9/1977 | Benedict | 73/116 |
| 4,128,005 | 12/1978 | Arnston et al. | 73/117.3 |
| 4,145,746 | 3/1979 | Trussell et al. | 364/551 |
| 4,170,131 | 10/1979 | Gniewek et al. | 73/116 |
| 4,179,922 | 12/1979 | Bouverie et al. | 73/116 |
| 4,291,383 | 9/1981 | Tedeschi et al. | 364/551 |

Primary Examiner—Jerry W. Myracle
Attorney, Agent, or Firm—Kinney, Lange, Braddock, Westman and Fairbairn

[57] ABSTRACT

An engine analyzer performs electrical tests on a multi-cylinder internal combustion engine under the control of the digital computer. The engine analyzer includes a hardware cylinder counter which keeps track of the current cylinder number while various engine tests are performed. The hardware cylinder counter is a programmable digital counter under the control of the computer which performs the cylinder count function independent of operation of the computer. The counter has jam inputs for receiving an input count from the computer which represents the number of cylinders of the engine under test. The counter is counted down in response to a cylinder clock signal. The counter is reset to the digital value at its jam inputs whenever its Set input is pulsed. A synchronizing circuit is responsive to a No. 1 cylinder pulse and to a carry-out pulse which is produced by the counter when the count reaches zero. The counter is reset to the input count whenever the No. 1 pulse or the carry-out pulse is present. As a result, cylinder counts are maintained at all times, even if the No. 1 pulse is lost or not available. The counter provides an output count to the computer (and to other devices under the control of the computer) for use in various engine tests including waveform displays, power check, and engine timing measurements.

9 Claims, 6 Drawing Figures

COMPUTER BASED ENGINE ANALYZER WITH HARDWARE CYLINDER COUNTER

REFERENCE TO CO-PENDING APPLICATIONS

Reference is hereby made to the following co-pending U.S. patent applications, in which the cylinder counter of the present invention is disclosed but not claimed: "Engine Analyzer With Digital Waveform Display", J. Marino, M. Kling and S. Roth Ser. No. 327,734; "Engine Analyzer With Constant Width Digital Waveform Display", J. Marino and M. Kling Ser. No. 327,511 now U.S. Pat. No. 4,399,407; and "Engine Timing Apparatus", J. Marino, M. Kling and S. Roth Ser. No. 327,497. All of these applications are assigned to the same assignee as the present application.

BACKGROUND OF THE INVENTION

1. Field of the Invention

The present invention relates to computer controlled engine analyzer apparatus for testing multi-cylinder internal combustion engines. In particular, the present invention relates to apparatus for keeping track of cylinder number in a computer-controlled engine analyzer.

2. Description of the Prior Art

With the advent of low-cost microelectronic devices, and in particular microprocessors, digital electronic systems have found increasing use in a wide variety of applications. Digital electronic systems have many significant advantages over analog systems, including increased ability to analyze and store data, higher accuracy, greater flexibility in design and application, and the ability to interface with computers having larger and more sophisticated data processing and storage capabilities. In the past, some engine analyzer systems for performing tests on multi-cylinder internal combustion engines have been proposed which utilize microprocessors and digital circuitry to control some of the functions of the engine analyzer apparatus.

In any multi-function engine analyzer, there is a need to keep track of the current cylinder number so that engine tests such as displaying primary and secondary ignition waveforms, power checking and engine timing measurements can be performed. U.S. Pat. No. 3,572,103 by J. Marino shows one arrangement used in the prior art for keeping track of the cylinder number. In this patent, a ring counter driven by pulses from the ignition system maintains the cylinder count. The number of stages of the ring counter is selectable by a cylinder selector switch. The operator sets the selector switch to the proper number of cylinders, and the selector switch in turn enables the necessary stages of the ring counter.

SUMMARY OF THE INVENTION

The present invention is an improved digital computer-controlled engine analyzer apparatus for use in testing multi-cylinder internal combustion engines. The engine analyzer includes operator input means for providing operator input signals indicating a selected test to be performed, and includes display means for displaying visually test results of the selected test after it has been performed. The digital computer controls electrical test means which derive electrical signals from the engine indicating operation of a system or component of the engine.

In the present invention, a programmable digital cylinder counter keeps track of the current cylinder number so that the digital computer means is not burdened by continual updating of cylinder counts. The programmable digital cylinder counter includes output terminals for providing a digital cylinder count output, input terminals for receiving an initial count representative of the number of cylinders of the engine, an output terminal which produces a counter output signal when the digital cylinder count output reaches zero, a clock input for receiving a cylinder clock signal representative of sequential operation of the cylinders of the engine, and a set input. The counter is decremented in response to the cylinder clock signal, and is reset in response to a signal at its set input.

Reset means responsive to the counter output signal provides the reset signal to the set input of the cylinder counter to cause the cylinder counter to be reset to the initial count. The digital computer provides the initial count to the input terminals of the programmable digital cylinder counter. As a result, the programmable digital cylinder counter is under control of the digital computer (which provides the initial count) and yet maintains cylinder counts at all times independent of operation of the digital computer.

In the preferred embodiment of the present invention, means are provided for deriving a NO. 1 PULSE signal from the engine which represents firing of a No. 1 cylinder of the engine. The reset means is responsive to both the NO. 1 PULSE and the CYLINDER OUTPUT signal, so that the cylinder counter is reset each time either the NO. 1 PULSE signal is received or the counter outout signal is produced. As a result, the counter is synchronized to the operation of the engine by the No. 1 pulse, and thereafter remains in synchronization even if the NO. 1 PULSE signal is no longer present, as long as the CYLINDER CLOCK signal continues to be produced.

DETAILED DESCRIPTION OF THE PREFERRED EMBODIMENTS

Figure 1:
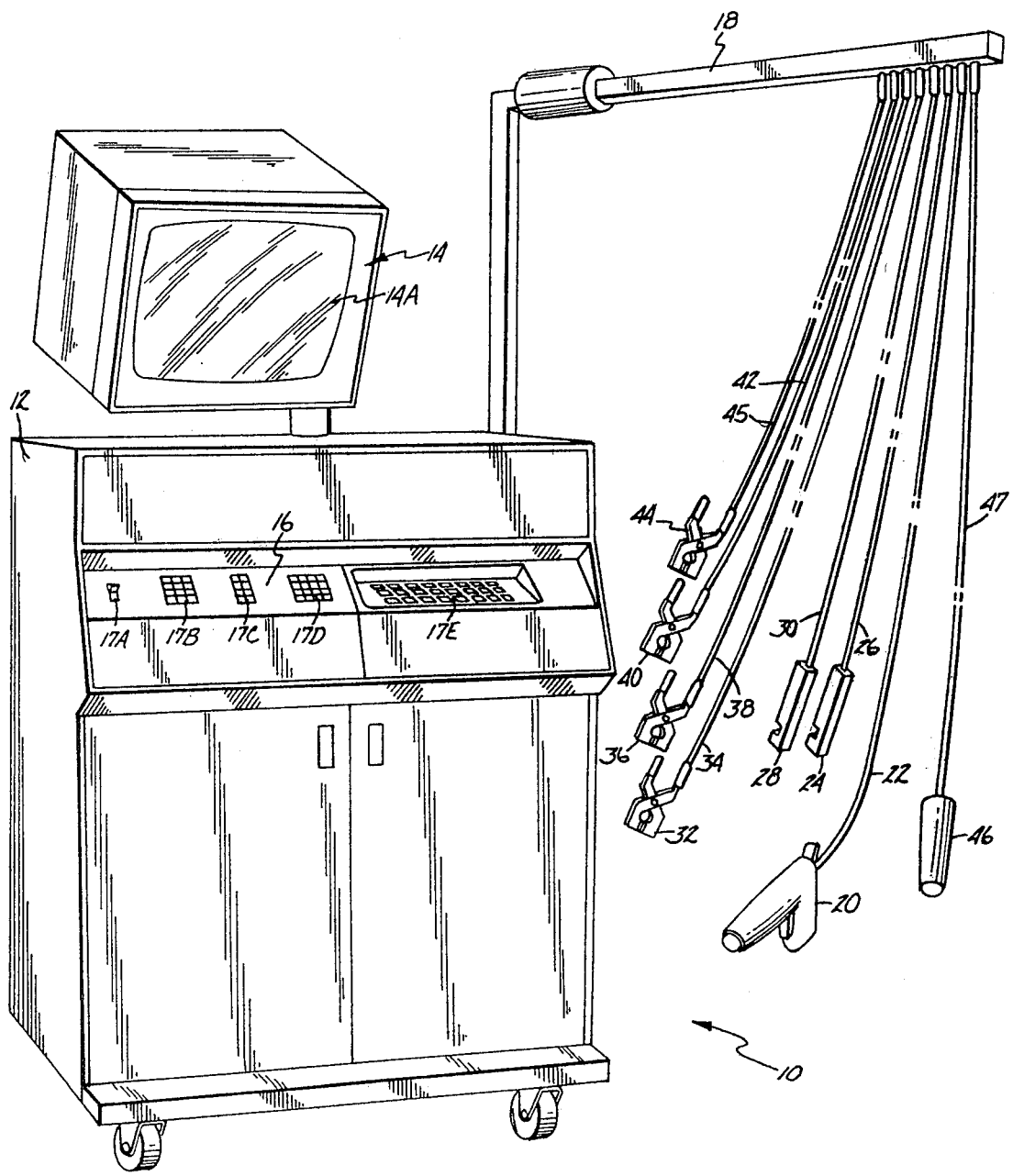
FIG. 1 is a perspective view showing an engine analyzer apparatus which utilizes the hardware cylinder counter of the present invention.

In FIG. 1, engine analyzer 10 is shown. Mounted at the front of housing 12 of analyzer 10 are cathode ray tube (CRT) raster scan display 14 and user interface 16, which is preferably a control panel having a power switch 17A, three groups of control switches or keys 17B–17D, as well as a keyboard 17E for entering numerical information. Extending from boom 18 are a plurality of cables which are electrically connected to the circuitry within housing 12, and which are intended for use during operation of the analyzer 10. Timing light 20 is connected at the end of multiconductor cable 22. "High tension" (HT) probe 24 is connected at the end of multiconductor cable 26, and is used for sensing secondary voltage of the ignition system of an internal combustion engine of a vehicle (not shown). "No. 1" probe 28 is connected to the end of multiconductor cable 30, and is used to sense the electrical signal being supplied to the No. 1 sparkplug of the ignition system. "Engine Ground" connector 32, which is preferably an alligator-type clamp, is connected at the end of cable 34, and is typically connected to the ground terminal of the battery of the ignition system. "Points" connector 36, which is preferably an alligator-type clamp, is attached to the end of cable 38 and is intended to be connected to one of the primary winding terminals of an ignition coil of the ignition system. "Coil" connector 40, which is preferably an alligator-type clamp attached to the end of cable 42, is intended to be connected to the other primary winding terminal of the ignition coil. "Battery" connector 44, which is preferably an alligator-type clamp, is attached to the end of cable 45. Battery connector 44 is connected to the "hot" or "non-ground" terminal of the battery of the ignition system. Vacuum transducer 46 at the end of multiconductor cable 47 produces an electrical signal which is a linear function of vacuum or pressure, such as intake manifold vacuum or pressure.

Figure 2:
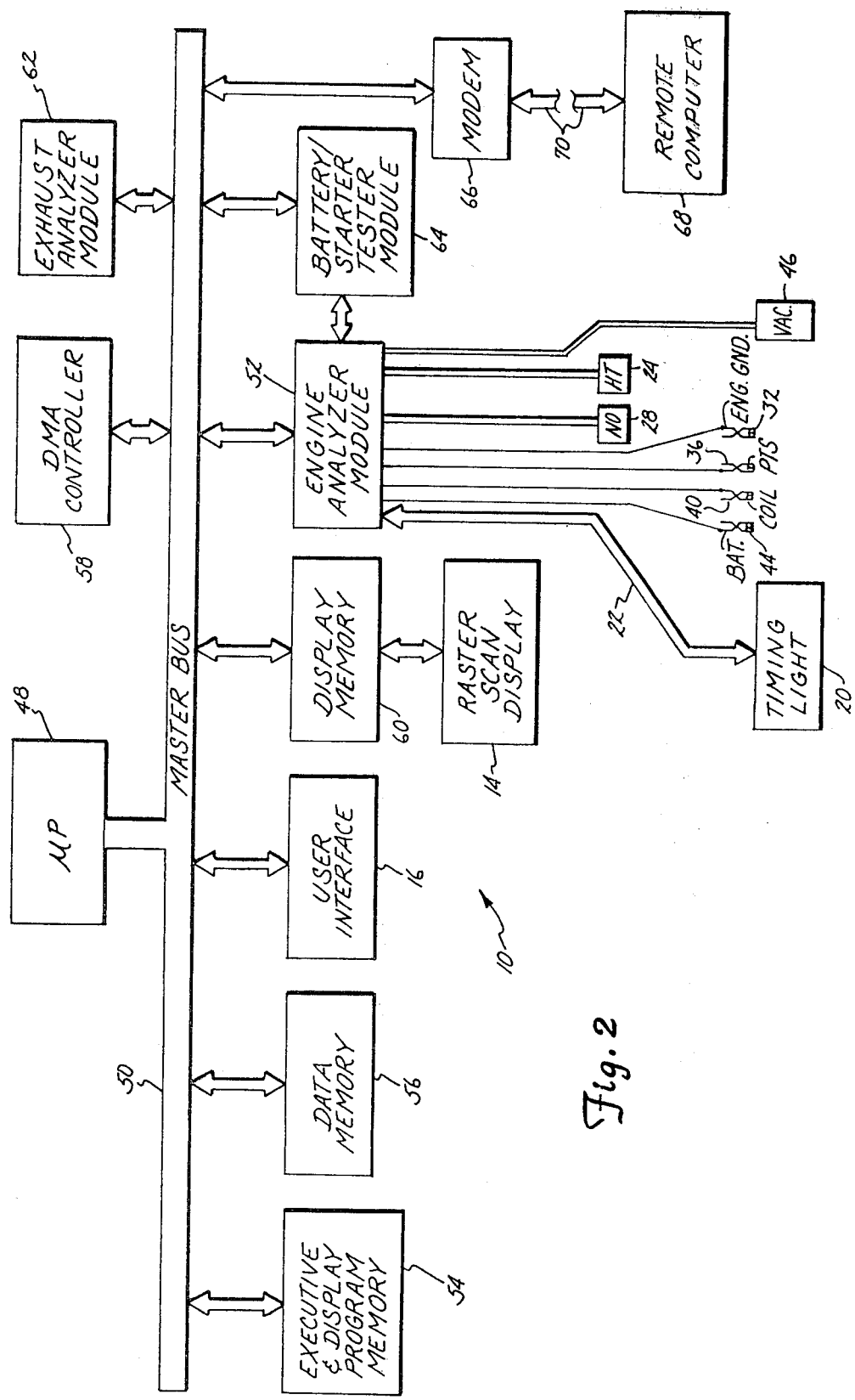
FIG. 2 is an electrical block diagram of the engine analyzer apparatus of FIG. 1.

FIG. 2 is an electrical block diagram showing engine analyzer 10 of the present invention. Operation of engine analyzer 10, is controlled by microprocessor 48, which communicates with the various subsystems of engine analyzer 10 by means of master bus 50. In the preferred embodiments of the present invention, master bus 50 is made up of fifty-six lines, which form a data bus, an address bus, a control bus, and a power bus.

Timing light 20, HT probe 24, No. 1 probe 28, Engine Ground connector 32, Points connector 36, Coil connector 40, Battery connector 44, and vacuum transducer 46 interface with the electrical system of engine analyzer 10 through engine-analyzer module 52. As described in further detail later, engine analyzer module 52 includes a digital section and an analog section. Input signal processing is performed in the analog section, and the input analog waveforms received are converted to digital waveforms in the form of digital data. The digital section of engine analyzer module 52 interfaces with master bus 50. The cylinder counting function which forms the basis of the present invention is performed in the digital section.

Control of the engine analyzer system 10 by microprocessor 48 is based upon a stored program in engine analyzer module 52 and a stored program in executive and display program memory 54 (which interfaces with master bus 50). Digitized waveforms produced, for example, by engine analyzer module 52 are stored in data memory 56. The transfer of digitized waveforms from engine analyzer module 52 to data memory 56 is provided by direct memory access (DMA) controller 58.

User interface 16 interfaces with master bus 50 and permits the operator to enter data and select particular tests or particular waveforms to be displayed.

Display memory 60 contains one bit for each picture element (pixel) that can be displayed on raster scan display 14. Each bit corresponds to a dot on the screen of raster scan display 14.

As further illustrated in FIG. 2, engine analyzer 10 has the capability of expansion to perform other engine test functions by adding other test modules. These modules can include, for example, exhaust analyzer module 62 and battery/starter tester module 64. Both modules 62 and 64 interface with the remaining system of analyzer 10 through master bus 50 and provide digital data or digitized waveforms based upon the particular tests performed by those modules. In the preferred embodiments shown in FIG. 2, modulator/demodulator (MODEM) 66 also interfaces with master bus 50, to permit analyzer 10 to interface with remote computer 68 through communiction link 70. This is a particularly advantageous feature, since remote computer 68 typically has greater data storage and computational capabilities that are present within analyzer 10. Modem 66 permits digitized waveforms stored in data memory 56 to be transferred to remote computer 68 for further analysis, and also provides remote computer 68 to provide test parameters and other control information to microprocessor 48 for use in testing.

Figure 3:
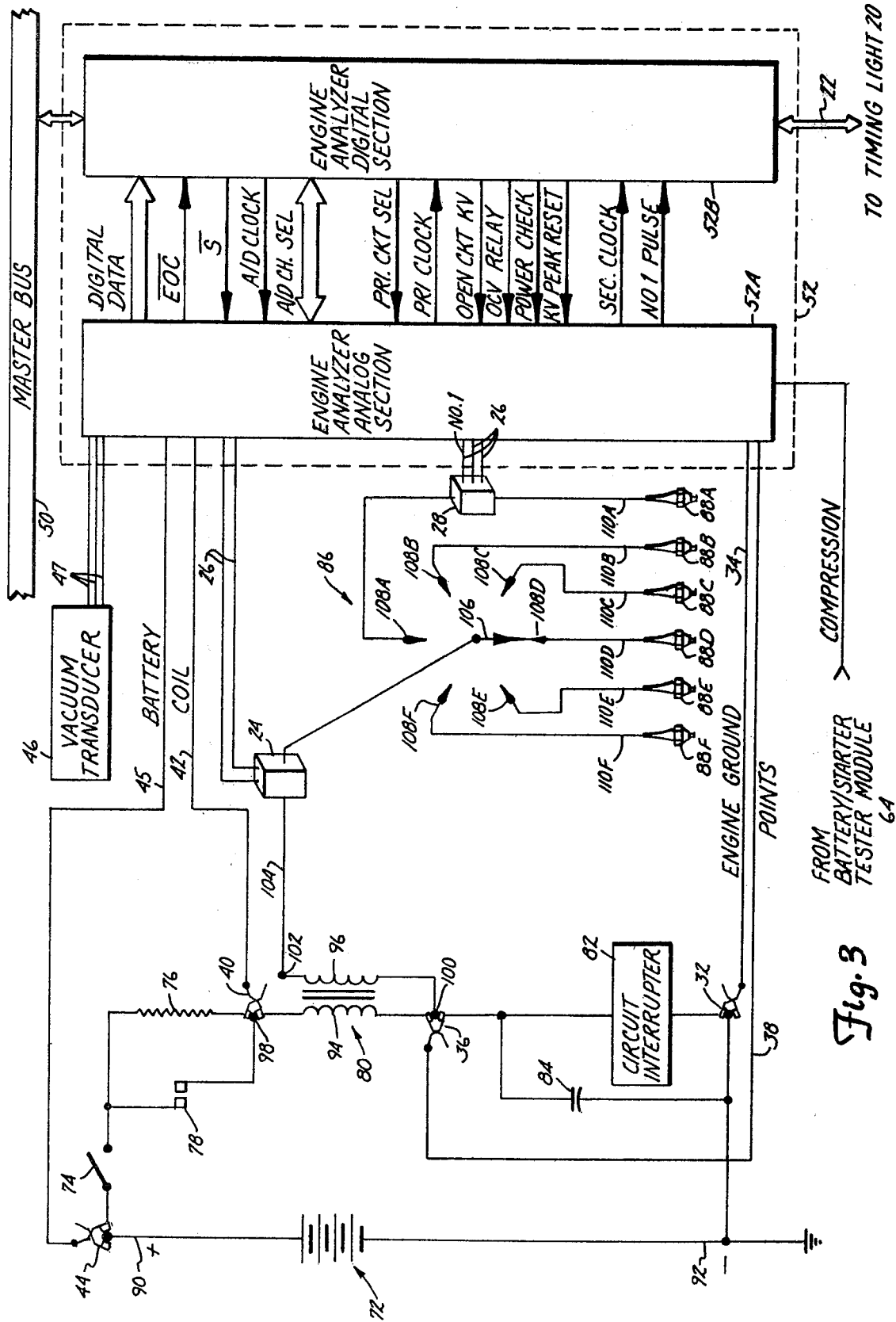
FIG. 3 shows the engine analyzer module of the apparatus of FIG. 2 in electrical schematic form in connection with a conventional ignition system of an internal combustion engine.

FIG. 3 shows engine analyzer 52 connected to a vehicle ignition system, which is schematically illustrated. The ignition system includes battery 72, ignition switch 74, ballast resistor 76, relay contacts 78, ignition coil 80, circuit interrupter 82, condensor 84, distributor 86, and igniters 88A–88F. The particular ignition system shown in FIG. 3 is for a six-cylinder internal combustion engine. Engine analyzer 10 of the present invention may be used with a wide variety of different engines having different (even or odd) numbers of cylinders. The six-cylinder ignition system shown in FIG. 3 is strictly for the purpose of example.

In FIG. 3, battery 72 has its positive (+) terminal 90 connected to one terminal of ignition switch 74, and its negative (−) terminal 92 connected to engine ground. Ignition switch 74 is connected in a series current path with ballast resistor 76, primary winding 94 of ignition coil 80, and circuit interrupter 82 between positive terminal 90 and engine ground (i.e. negative terminal 92). Relay contacts 78 are connected in parallel with ballast resistor 76, and are normally open during operation of the engine. Relay contacts 78 are closed during starting of the engine by a relay coil associated with the starter/cranking system (not shown) so as to short out ballast resistor 76 and thus reduce resistance in the series current path during starting of the engine.

Condensor 84 is connected in parallel with circuit interrupter 82, and is the conventional capacitor used in ignition systems. Circuit interrupter 82 is, for example, conventional breaker points operated by a cam associated with distributor 86, or is a solid state switching element in the case of solid state ignition systems now available in various automobiles.

As shown in FIG. 3, ignition coil 80 has three terminals 98, 100, and 102. Low voltage primary winding 94 is connected between terminals 98 and 100. Terminal 98 is connected to ballast resistor 76, while terminal 100 is connected to circuit interrupter 82. High voltage secondary winding 96 of ignition coil 80 is connected between terminal 100 and terminal 102. High tension wire 104 connects terminal 102 of coil 80 to distributor arm 106 of distributor 86. Distributor arm 106 is driven by the engine and sequentially makes contact with terminals 108A–108F of distributor 86. Wires 110A–110F connect terminals 108A–108F with igniters 88A–88F, respectively. Igniters 88A–88F normally take the form of conventional spark plugs. While igniters 88A–88F are shown in FIG. 3 as located in a continuous row, it will be understood that they are associated with the cylinders of the engine in such a manner as to produce the desired firing sequence. Upon rotation of distributor arm 106, voltage induced in secondary winding 96 of ignition coil 80 is successively applied to the various igniters 88A–88F in the desired firing sequence.

As shown in FIG. 3, engine analyzer 10 interfaces with the engine ignition system through engine analyzer module 52, which includes engine analyzer analog section 52A and engine analyzer digital section 52B. Input signals are derived from the ignition system by means of Engine Ground connector 32, Points connector 36, Coil connector 40, Battery connector 44, HT secondary voltage probe 24, and No. 1 probe 28. In addition, a vacuum/pressure electrical input signal is produced by vacuum transducer 46, and a COMPRESSION input signal (derived from starter current) is produced by battery/starter tester module 64. These input signals are received by engine analyzer analog section 52A and are converted to digital signals which are then supplied to engine analyzer digital section 52B. Communication between engine analyzer module 52 and microprocessor 48, data memory 56, and DMA controller 58 is provided by engine analyzer digital section 52B through master bus 50. In addition, engine analyzer digital section 52B interfaces with timing light 20 through cable 22.

As illustrated in FIG. 3, Engine Ground connector 32 is connected to negative terminal 92 of battery 72, or other suitable ground on the engine. Points connector 36 is connected to terminal 100 of ignition coil 80, which in turn is connected to circuit interrupter 82. As discussed previously, circuit interrupter 82 may be conventional breaker points or a solid state switching device of a solid state ignition system. Coil connector 40 is connected to terminal 98 of coil ignition 80, and Battery connector 44 is connected to positive terminal 90 of battery 72. All four connectors 32, 36, 40 and 44 are, therefore, connected to readily accessible terminals of the ignition system, and do not require removal of conductors in order to make connections to the ignition system.

HT probe 24 is a conventional probe used to sense secondary voltage by sensing current flow through conductor 104. Similarly, No. 1 probe 28 is a conventional probe used to sense current flow through wire 110A. In the example shown in FIG. 3, igniter 88A has been designated as the igniter for the "No. 1" cylinder of the engine. Both probe 24 and probe 28 merely clamp around existing conductors, and thus do not require removal of conductors in order to make measurements.

Figure 4:
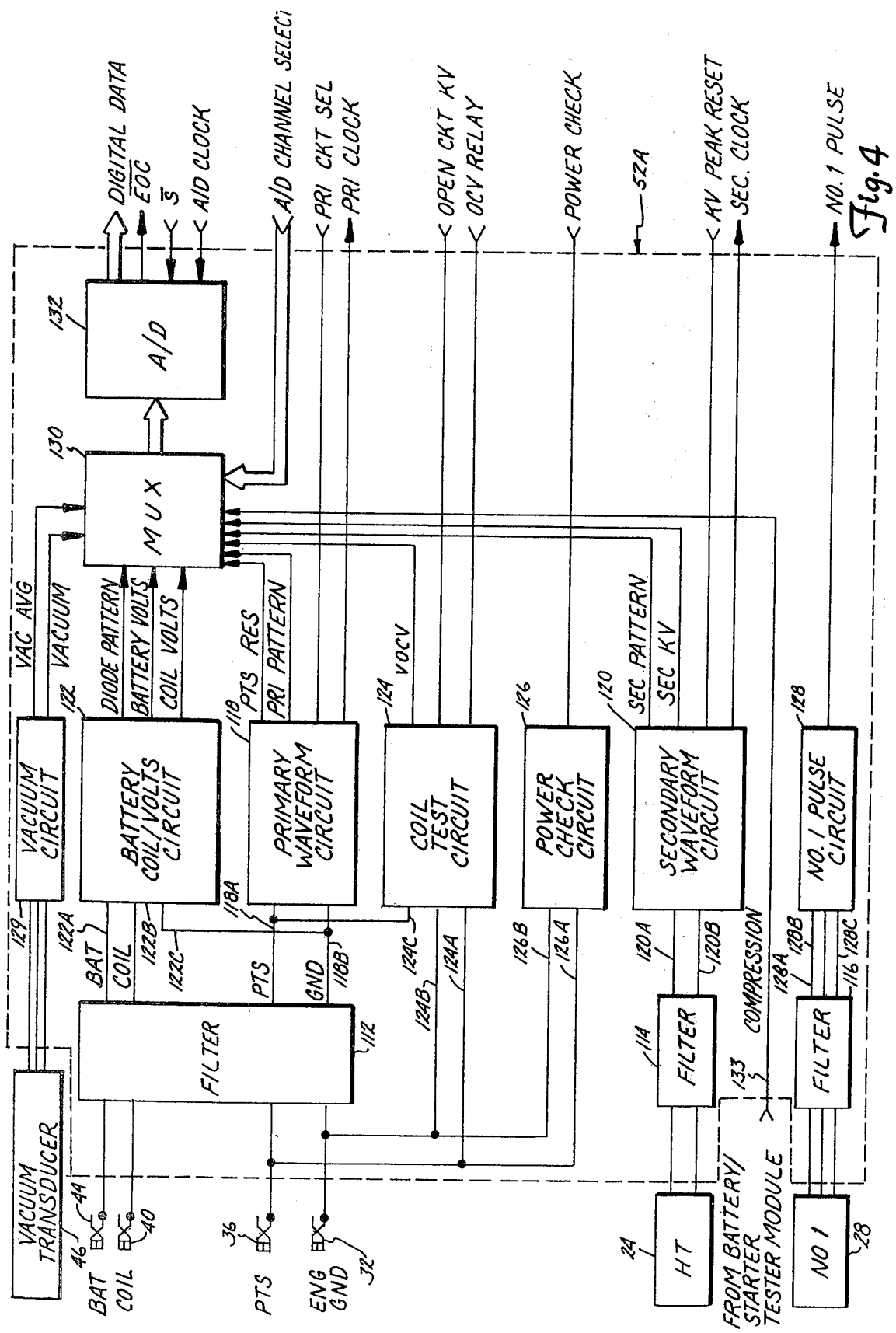
FIG. 4 is an electrical block diagram of the analog section of the engine analyzer module of FIG. 3.

FIG. 4 is an electrical block diagram showing engine analyzer analog section 52A, together with HT probe 24, No. 1 probe 28, Engine Ground connector 32, Points connector 36, Coil connector 40, Battery connector 44, and vacuum transducer 46. Analog section 52A includes input filters 112, 114, and 116, primary waveform circuit 118, secondary waveform circuit 120, battery coil/volts circuit 122, coil test circuit 124, power check circuit 126, No. 1 pulse circuit 128, vacuum circuit 129, multiplexer (MUX) 130, and analog-to-digital (A/D) converter 132. Analog section 52A supplies digital data, an end-of-conversion signal (EOC), a primary clock signal (PRI CLOCK), a secondary clock signal (SEC CLOCK), and a NO. 1 PULSE signal to engine analyzer digital section 52B. Analog section 52A receives an $\overline{S}$ signal, an A/D CLOCK signal, A/D CHANNEL SELECT signals, a primary circuit select signal (PRI CKT SEL), an OPEN CKT KV signal, an OCV RELAY signal, a POWER CHECK signal and a KV PEAK RESET signal from engine analyzer digital section 52B.

For the description of the cylinder counter of the present invention, the PRI CLOCK signal from primary waveform circuit 118, the SEC CLOCK signal from secondary waveform circuit 120, and the NO. 1 PULSE signal from No. 1 pulse circuit 128 are the signals of interest. Production of these three signals will be discussed in detail while production of the other signals will not be discussed further. Reference may be made to the previously mentioned co-pending application by J. Marino, M. Kling and S. Roth entitled "Engine Analyzer with Digital Waveform Display" Ser. No. 327,734 for further description of analog section 52A.

Points connector 36 and engine ground connector 32 are connected through filter circuit 112 to inputs 118A and 118B, respectively, of primary waveform circuit 118. Filter circuits 112, 114 and 116 are preferably inductive-capacitive filters which filter input signals to suppress or minimize the high frequency noise signals typically generated by the ignition system. Based upon the signal appearing at its inputs, 118A and 118B, primary waveform circuit 118 supplies a primary clock signal to digital section 52B, and also provides a primary pattern (PRI PATTERN) waveform and a points resistance (PTS RES) signal to multiplexer 130.

The primary clock (PRI CLOCK) signal is a filtered signal that is 180° out of phase with the primary signal appearing between Points connector 36 and Engine Ground connector 32. The PRI CLOCK signal is a square wave signal that is high during the time period when the circuit interrupter 82 is conductive and is low during the time when circuit interrupter 82 is non-conductive. In preferred embodiments of the present invention, primary waveform circuit 118 amplifies the primary signal appearing between Points connector 36 and Engine Ground connector 32, filters the amplified signal, and compares the amplified and filtered signal to a reference or threshold voltage. This reference or threshold voltage has two levels, which are selectable by the PRI CKT SEL signal supplied by digital section 52B. The PRI CKT SEL signal causes primary waveform circuit 118 to use one threshold voltage level when conventional breaker points are used as circuit interrupter 82, and a second threshold voltage when circuit interrupter 82 is a solid state type of circuit interrupter (such as a General Motors HEI solid state ignition system).

In preferred embodiments of the present invention, primary waveform circuit 118 includes circuitry to invert the primary ignition signal in the event that the primary ignition signal is a negative going signal, which occurs with vehicles equipped with the battery positive terminal at engine ground. As a result, the PRI CLOCK signal produced by primary waveform circuit 118 is unchanged, regardless of whether the vehicle has a positive or negative ground.

The secondary voltage sensed by HT probe 24 is supplied through filter 114 to inputs 120A and 120B of secondary waveform circuit 120. The secondary voltage is reduced by a capacitive divider by a factor of 10,000, is supplied through a protective circuit which provides protection against intermittent high voltage spikes, and is introduced to three separate circuits. One circuit supplies the SEC CLOCK signal; a second circuit supplies a secondary pattern (SEC PATTERN) waveform to multiplexer 130, and a third circuit supplies the SEC KV signal to multiplexer 130.

The SEC CLOCK signal is a negative going signal which occurs once for each secondary ignition signal pulse, and has a duration of approximately 1 millisecond. The inverted secondary voltage signal is amplified and is used to drive two cascaded one shot multivibrators (not shown).

The signal from No. 1 voltage probe 28 is supplied through inductive-capacitive type filter 116 to inputs 128A–128C of No. 1 pulse circuit 128, where it is filtered, amplified, and used to drive a pair of cascaded one shot multivibrators (not shown). The resulting NO. 1 PULSE output signal of No. 1 pulse circuit 128 is a positive going pulse of 1 millisecond duration that corresponds in time to the ignition pulse supplied to the No. 1 ignition 88A (FIG. 3).

Figure 5:
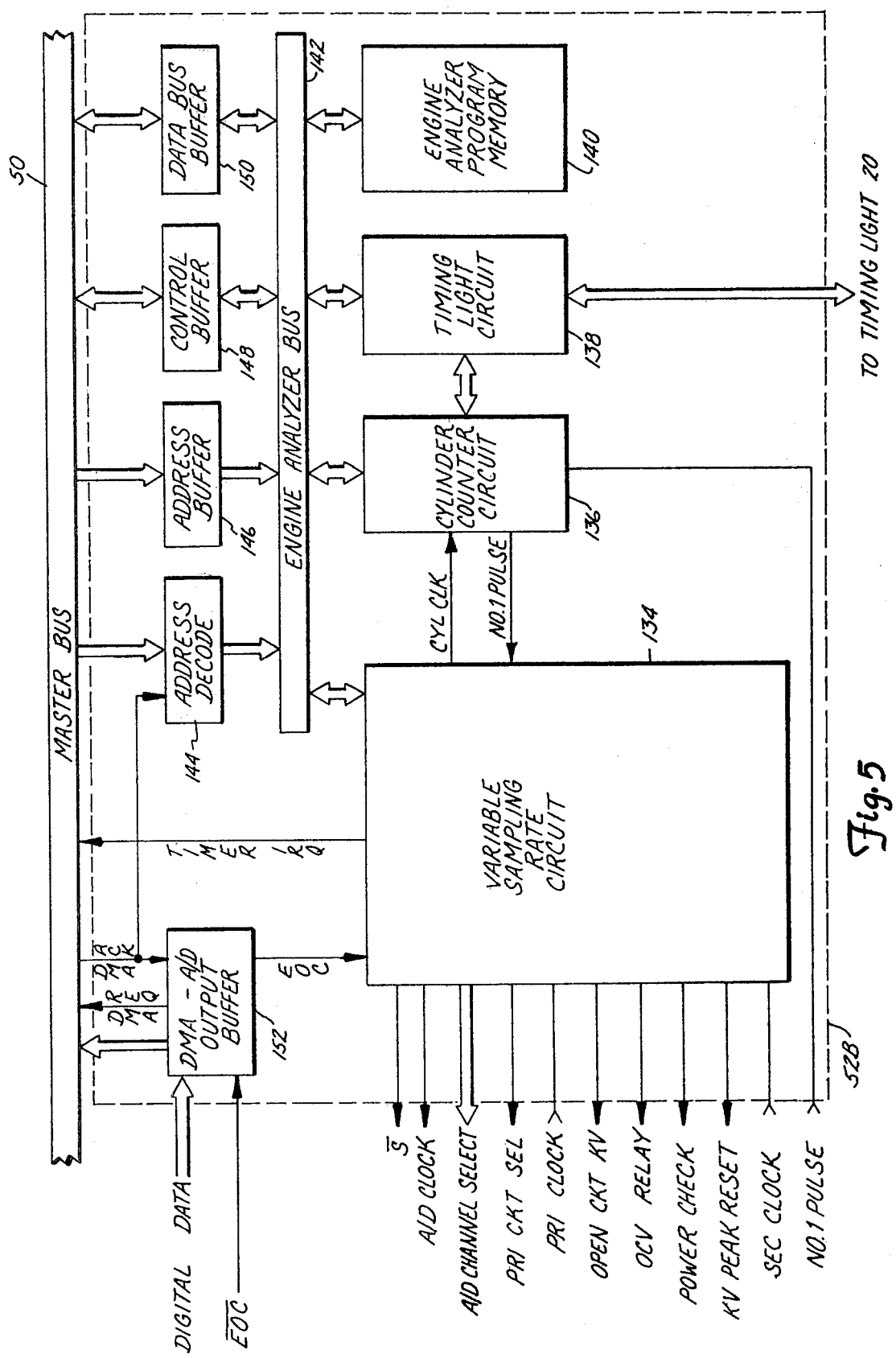
FIG. 5 is an electrical block diagram of the digital section of the engine analyzer module of FIG. 3.

FIG. 5 is an electrical block diagram of digital section 52B of engine analyzer module 52. Digital section 52B includes variable sampling rate circuit 134, cylinder counter circuit 136, timing light circuit 138 and engine analyzer program memory 140, all of which are connected to engine analyzer bus 142. In preferred embodiments of the present invention, engine analyzer bus 142 includes digital data lines, address lines and control lines. Interface between digital section 52B and the remaining circuitry of engine analyzer 10 is provided by means of master bus 50. Address decode circuit 144, address buffer circuit 146, control buffer circuit 148, data bus buffer circuit 150, and DMA-A/D output buffer circuit 152 provide an interface between master bus 50 and the remaining circuitry of digital section 52B.

Variable sampling rate circuit 134 receives the PRI CLOCK and SEC CLOCK signals from analog section 52A, and provides the various control signals -o analog section 52A which determine the particular test being performed and the particular digital data which is received from analog section 52A. These control signals include the $\overline{S}$ and A/D CLOCK signals supplied to A/D converter 132, the A/D CHANNEL SELECT signal supplied to muliplexer 130, the PRI CKT SEL signal supplied to primary waveform circuit 118, the OPEN CKT KV and OCV RELAY signals supplied to coil test circuit 124, the POWER CHECK signal supplied to power check circuit 126 and the KV PEAK RESET signal supplied to secondary waveform circuit 120. Variable sampling rate circuit 134 produces the CYL CLK signal, which is based upon either the PRI CLOCK or the SEC CLOCK signal and supplies this signal to cylinder counter circuit 136. The CYL CLK signal is also used by variable sampling rate circuit 134 to determine the period of the primary or secondary waveform. Variable sampling rate circuit 134 supplies this period measurement to microprocessor 48 via engine analyzer bus 142 and master bus 150. Based upon this period measurement, microprocessor 48 selects the desired data sample rate to be used by A/D converter 132, and supplies control signals to variable sampling rate circuit 134 via master bus 150 and engine analyzer bus 142. The data sample rate is controlled by variable sampling rate circuit 134 by means of the A/D CLOCK signal. Variable sampling rate circuit 134 also receives the EOC signal from DMA-A/D output buffer 152 and the NO. 1 PULSE signal from cylinder counter circuit 136.

In many of the test functions performed by engine analyzer module 52, it is necessary to determine the current cylinder number at various points in time. These engine tests include waveform displays, power check tests and engine timing measurements. Keeping track of cylinder number by using microprocessor 48 becomes inconvenient, particularly when microprocessor 48 is involved in digitizing waveforms, and in reconstructing waveforms for display on raster scan display 14. In the preferred embodiment of the present invention shown in FIG. 5, cylinder counter circuit 136 performs this cylinder number tracking function. Cylinder counter circuit 136 includes a presettable countdown counter which is loaded with the number of cylinders of the engine under test by data supplied from microprocessor 48 through master bus 50, data bus 150 and engine analyzer bus 142. The number of cylinders of the engine under test is typically supplied to microprocessor 48 through user interface 16.

Cylinder counter circuit 136 counts down in response to the CYL CLK signal. The current count of cylinder counter circuit 136 is provided both to the engine analyzer bus 142 (and thus to microprocessor 48) and to timing light circuit 138.

The NO. 1 PULSE signal from analog section 52A is supplied to cylinder counter circuit 136. At the beginning of operation of engine analyzer module 52, the first pulse of the NO. 1 PULSE signal presets cylinder counter circuit 136 and thereby synchronizes it to the engine. After that, the No. 1 probe 28 can be removed and the NO. 1 PULSE signal discontinued, and cylinder counter circuit 136 will still remain in synchronization with the engine as long as the CYL CLK signal continues to be supplied. Cylinder counter circuit 136 also is capable of operation without the NO. 1 PULSE signal, and in that case is synchronized to the engine operation by manual inputs supplied by the operator through a BUMP control switch 192 (described later in conjunction with FIG. 6) on timing light 20.

Timing light circuit 138 controls operation of timing light 20, based upon control signals from microcomputer 48, the cylinder count from cylinder counter circuit 136, and operator input signals supplied from control switches on timing light 20.

In the preferred embodiment shown in FIG. 5, the operation of engine analyzer module 52, under the control of microprocessor 48, is based upon a stored engine analyzer program stored in engine analyzer program memory 140. When the operator selects, through user interface 16, a test function involving engine analyzer module 52, microprocessor 48 interrogates engine analyzer module 52 to determine that it is present in the system, and addresses engine analyzer program memory 140 for the operating instructions required for that particular test. In preferred embodiments of the present invention, each test module such as engine analyzer module 52, exhaust analyzer module 62, and battery/starter tester module 64 (FIG. 2) has its own associated program memory. As a result, only that memory capacity required for the particular test modules being used is provided.

Figure 6:
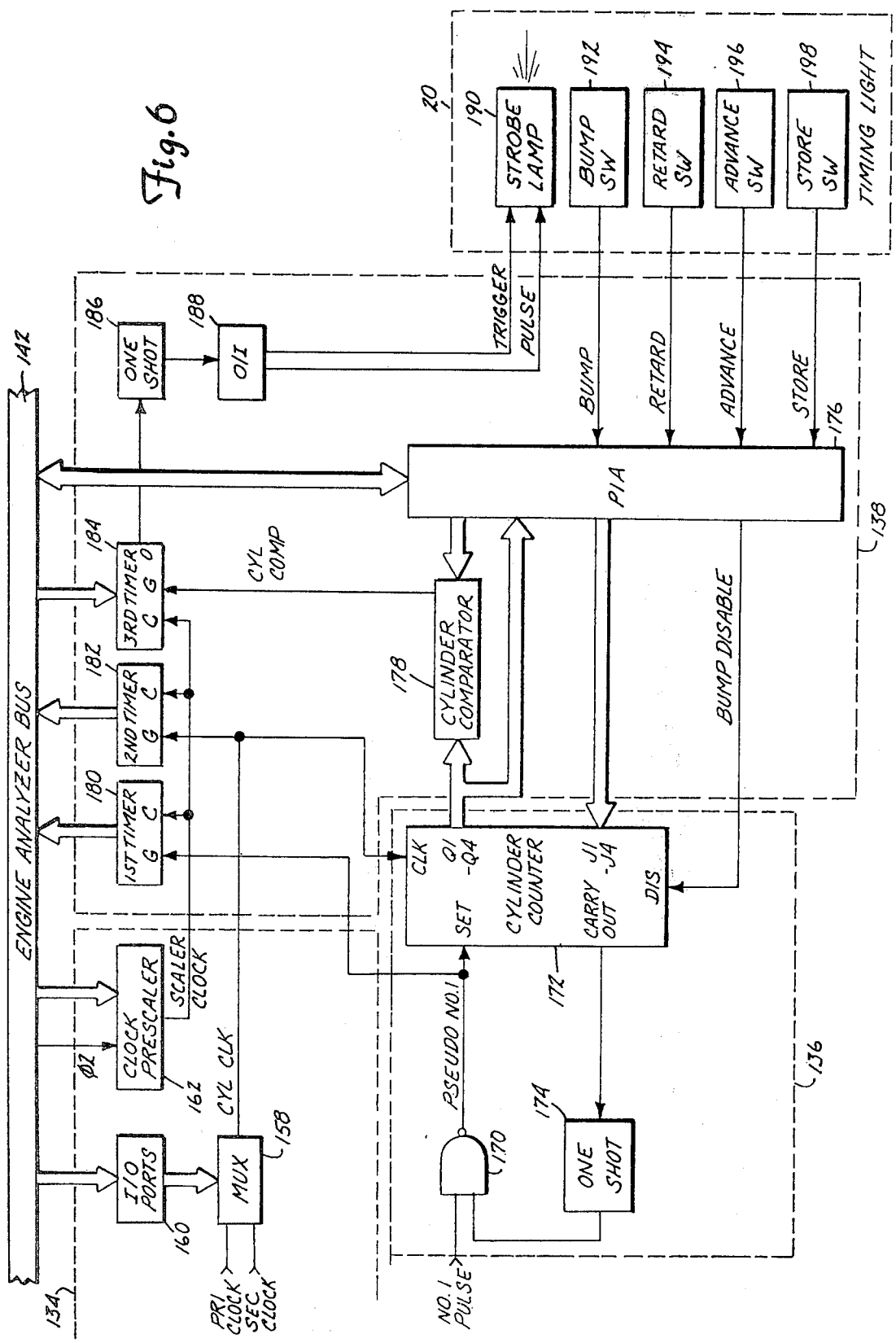
FIG. 6 is an electrical block diagram of the timing light together with those portions of the digital section shown in FIG. 5 which relate to the engine timing function, including the hardware cylinder counter.

FIG. 6 is an electrical block diagram which shows timing light 20, as well as those portions of digital section 52B which are specifically concerned with the engine timing function, including cylinder counter circuit 136 of the present invention. Although cylinder counter circuit 136 is used for a wide variety of different test functions, the engine timing function will be described in detail because it is representative of the various functions performed by cylinder counter circuit 136.

As shown in FIG. 6, a portion of variable sampling rate circuit 134 including multiplexer 158, input/output (I/O) ports 160, and clock prescaler 162 are used in the engine timing function. Multiplexer 158 receives the PRI CLK and SEC CLK signal from analog section 52A. Multiplexer 158 supplies one of these signals as the CYL CLK signal to both cylinder counter circuit 136 and timing light circuit 138.

Clock prescaler 162 receives data from engine analyzer bus 142 which selects a frequency for its SCALER CLOCK output signal. Clock prescaler 162 also receives a clock signal $\phi 2$ from engine analyzer bus 142, which is preferably on the order of 1 MHz. Microprocessor 48 selects, by the scaling factor supplied to clock prescaler 162, either the 1 MHz frequency of the $\phi 2$ signal or some lower frequency for the SCALER CLOCK signal frequency.

Cylinder counter circuit 136 includes NAND gate 170, cylinder counter 172, and one shot multivibrator 174. Cylinder counter circuit 136 receives the NO. 1 PULSE signal (if present) from analog section 52A, the CYL CLK signal from multiplexer 158, a digital value J representative of the number of cylinders of the engine from microprocessor 48 via timing light circuit 138, and a MP DISABLE signal from timing light circuit 138. The outputs of cylinder counter circuit 136 are a PSEUDO NO. 1 pulse signal and a digital count Q, both of which are supplied to timing light circuit 138.

Timing light circuit 138 includes programmable interface adapter (PIA) 176, cylinder comparator 178, first timer 180, second timer 182, third timer 184, one shot multivibrator 186, and opto-isolator (O/I) 188. Timing light circuit 138 communicates with microprocessor 48 through engine analyzer bus 142, and also receives the CYL CLK and SCALER CLOCK signals from variable timing circuit 134, the PSEUDO NO. 1 signal and the cylinder count Q from cylinder counter circuit 136, and BUMP, RETARD, ADVANCE and STORE signals from timing light 20. The outputs of timing light circuit 138 include the digital cylinder number J and the BUMP DISABLE signal supplied to cylinder counter circuit 136, measured times supplied by first and second timers 180 and 182 supplied to engine analyzer bus 142, output values from PIA 176 supplied to engine analyzer bus 142, and the output of opto-isolator 188, which flashes timing light 20.

As shown in FIG. 6, timing light 20 includes strobe lamp 190 and four input switches or buttons: Bump switch 192, Retard switch 194, Advance switch 196, and Store switch 198. Strobe lamp 190 is flashed each time an output signal is supplied from opto-isolator 188 of timing light circuit 138. In a preferred embodiment, strobe lamp 190 is powered by twelve volts DC and is triggered by the timing light trigger pulse from opto-isolator 188.

Bump switch 192 is preferably a pushbutton switch which is actuated by the operator to cause the timing reference to switch to another cylinder when timing light 20 is used without having No. 1 probe 28 connected. When No. 1 probe 28 is used, Bump switch 192 has no effect.

Retard switch 194 provides the RETARD signal to PIA 176. Retard switch 194 is a operator-actuated pushbutton switch which causes the flash delay to decrease incrementally as long as Retard switch 194 is pressed.

Advance switch 196 is a pushbutton switch which supplies the ADVANCE signal to PIA 176. The effect of Advance switch 196 is the opposite of Retard switch 194. In other words, Advance switch 196 causes the flash delay to increase incrementally as long as Advance switch 196 is pressed.

Store switch 198 supplies a STORE signal to PIA 176 which causes microprocessor 48 to store the current timing advance/retard angle reading.

In general, the operation of the engine timing apparatus requires the operator to adjust the flashing of strobe lamp 190 so that the timing mark illuminated by strobe lamp 190 comes into alignment with a top dead center position mark by use of Retard switch 194 and Advance switch 196. Once the timing mark is aligned with the top dead center position, the operator presses Store switch 198, and microprocessor 48 computes and displays the timing advance/retard angle on raster scan display 14.

In the preferred embodiment of the present invention illustrated in FIG. 6, cylinder counter 172 is a presettable divide-by-16 count down counter which is loaded with a value J equal to the number of cylinders via jam inputs J1–J4. This value J is supplied by microprocessor 48 through PIA 176. Counter 172 presets itself to the value J at jam inputs J1–J4 each time an input signal is received at its SET input.

Cylinder counter 172 receives the CYL CLK signal at its clock (CLK) input. Counter 172, therefore, keeps track of the current cylinder number and also generates the PSEUDO NO. 1 pulse as an engine sync pulse. If No. 1 probe 28 is providing the NO. 1 PULSE signal to NAND gate 170, this pulse is supplied through NAND gate 170 to the SET input of cylinder counter 172. In that case, the PSEUDO NO. 1 pulse corresponds to the firing of the cylinder detected by the No. 1 probe 28 (in the example shown in FIG. 2, the No. 1 cylinder corresponds to igniter 88A). If, on the other hand, No. 1 probe 28 is not connected, the CARRYOUT output of cylinder counter 172 triggers one shot 174, which supplies a PSEUDO NO. 1 pulse through NAND gate 170 to reset counter 172. In this case, the PSEUDO NO. 1 pulse is synchronized to the operation of the engine in time, but does not necessarily correspond to the actual No. 1 cylinder. By using Bump switch 192 on timing light 20, the operator can adjust the synchronization of cylinder counter 172 to correspond to the No. 1 cylinder or its complement when No. 1 probe 28 is not connected.

When Bump switch 192 is pressed, microprocessor 48 supplies a BUMP DISABLE signal through PIA 176 to the DIS input of cylinder counter 172. This disables counter 172 and prevents it from counting in response to one pulse of the CYL CLK signal. As a result, cylinder counter 172 has effectively skipped one cylinder, and the PSEUDO NO. 1 pulse generated will correspond to the next later cylinder from that which it corresponded to before bump switch 192 was pressed. By continued operation of Bump switch 192, the operator can cause cylinder counter 172 to shift the occurrence of the PSEUDO NO. 1 pulse until it corresponds to either the No. 1 cylinder or its complement. Since the crank shaft of a typical four-cycle internal combustion engine rotates twice for one complete cycle of all cylinders, the flashing of the strobe lamp 190 corresponding to either the No. 1 cylinder or its complement (i.e. a cylinder half-way through the total number of cylinders) will illuminate the timing mark.

The output Q of cylinder counter 172 is a digital counter Q which appears at its Q1–Q4 outputs. This digital count Q is supplied to cylinder comparator 178 and to microprocessor 48 through PIA 176.

First timer 180 of timing light circuit 138 receives the SCALER CLOCK signal at its clock (C) input and the PSEUDO NO. 1 signal at its gate (G) input. It supplies an output count to microprocessor 48 through engine analyzer bus 142. First timer 180 measures the time period $P_1$ between PSEUDO NO. 1 pulses. Time period $P_1$ is used by microprocessor 48 For calculation of engine speed and flash delay time.

Second timer 182 receives a SCALER CLOCK signal at its clock (C) input and the CYL CLK signal at its gate (G) input. The output of second timer 182 is a count representing the time period of any selected cylinder. Second timer 182 is used particularly to measure the time period $P_N$ which represents the period of the cylinder N immediately preceding the No. 1 cylinder (as indicated by the PSEUDO NO. 1 pulse). In the specific example shown in FIG. 3, cylinder N corresponds to igniter 88F.

Cylinder comparator 178 compares the count output Q of cylinder counter 172 with a comparison cylinder count N supplied by microprocessor 48 through PIA 176. This comparison count N corresponds to cylinder N, which is the cylinder preceding the No. 1 cylinder. When the cylinder count Q from cylinder (—SOUTH—) 76 corresponds to th comparison count N from PIA 176, cylinder comparator 178 provides the CYL COMP output signals to PIA 176 and to the gate (G) input of third timer 176.

Third timer 184 is in effect a programmable one shot which generates a pulse of variable width. The width of the pulse is controlled by microprocessor 48 by loading third timer 184 with a digital time delay value (TD). When third timer 184 is gated on by the CYL COMP signal, it counts in response to the SCALER CLOCK signal which is supplied to its clock (C) input. The output of third timer 184 remains high from the time it is gated on until it is counted down to zero.

Hardware one shot 186 is triggered by the falling edge of the output of third timer 184, and generates a trigger pulse of predetermined duration. The trigger pulse is supplied to opto-isolator 188, which in turn supplies the trigger pulse to strobe lamp 190.

The firing of strobe lamp 190, therefore, is controlled by microprocessor 48 by means of the digital time delay value TD loaded into third timer 184. This digital value controls the time delay between firing of the cylinder N (e.g. igniter 88F) immediately preceding the No. 1 cylinder (e.g. igniter 88A) and the trigger pulse supplied to strobe lamp 190.

In operation, the operator presses Retard switch 194 or Advance switch 196 until time delay TD has a value which synchronizes flashing of strobe lamp 190 so that the illuminated timing mark is aligned with the top dead center position. This is determined visually by the operator looking at the timing mark while strobe lamp 190 is being flashed. Once this desired condition is achieved, the operator presses Store switch 198. This signals microprocessor 48 that the desired value of time delay TD has been achieved. Microprocessor 48 then displays a value A° on raster scan display 14. This value A° represents the timing advance/retard value in degrees. If A° is positive, it represents an advance angle by which firing of cylinder No. 1 precedes top dead center. If A° is negative, it represents a retard angle corresponding to the number of degrees after top dead center at which cylinder No. 1 fires.

In the case of the engine timing function, microprocessor 48 uses cylinder comparator 178 to produce a CYL COMP signal to trigger third timer 184, and thus strobe lamp 190. In other functions, however, microprocessor 48 uses the Q output of cylinder counter 172 itself. Any time it is desired to know the current cylinder, microprocessor 48 reads the Q output of cylinder counter 172 via PIA 176. Since cylinder counter 172 is a count down cylinder counter, the No. 1 cylinder corresponds to Q=J (or to Q=zero, except the Q=zero appears for only a very short time on the Q1–Q4 outputs of cylinder counter 172). Microcomputer 48 determines the current cylinder number CYL NUM from the Q output as follows:

$$CYL\ NUM = J - Q + 1$$

For waveform digitizing functions, power check functions, and ignition coil test functions, microprocessor 48 uses this method to monitor the cylinder number CYL NUM and to determine when to activate the appropriate test circuitry.

The hardware cylinder counter of the present invention provides a simple, yet effective method of keeping track of current cylinder number in a computer controlled engine analyzer, without utilizing valuable computer time simply to update cylinder counts. The hardware cylinder counter circuit 136 of the present invention is under the control of microprocessor 48, by virtue of the input count J supplied to jam inputs J1–J4. This allows micropocessor 48 to select any number of cylinders (odd or even ) depending upon the engine being tested. Cylinder counter 136 also automatically resets itself through a reset circuit including NAND gate 170 and one shot 174, so that cylinder counts are maintained even if the NO. 1 PULSE signal is lost or not available. By use of the BUMP DISABLE signal, cylinder counter circuit 136 can be selectively disabled to allow the service technician or operator to synchronize operation of cylinder counter circuit 136 with the engine even if the NO. 1 PULSE signal is not available.

In conclusion, although the present invention has been described with reference to preferred embodiments, workers skilled in the art will recognize that changes may be made in form and detail without departing from the spirit and scope of the invention.

What is claimed is:

1. An engine test apparatus for use in testing of a multi-cylinder internal combustion engine, the apparatus comprising:
   cylinder clock means for deriving a cylinder clock signal representative of sequential operation of each cylinder of the engine, the cylinder clock signal exhibiting a predetermined signal transition for each cylinder;
   a presettable digital cylinder counter for counting down from an initial count (J) to zero in response to the predetermined signal transitions of the cylinder clock signal, the cylinder counter having output terminals for providing a digital cylinder count (Q) which is decremented with each predetermined signal transition, and input terminals for receiving the initial count (J) which is representative of the number of cylinders of the engine;
   means for producing a signal when the digital cylinder count (Q) reaches zero;

reset means for resetting the cylinder counter to the initial count (J) at the input terminals in response to the signal provided when the digital cylinder count (Q) reaches zero;

electrical test means for selectively deriving, from the engine, electrical signals indicative of operation of a system or component of the internal combustion engine;

operator input means for providing operator input signals indicative of a selected test to be performed;

display means for displaying visually a test result of the selected test performed; and digital computer means for controlling operation of the electrical test means as a function of the operator input signals and the digital cylinder count (Q) and for controlling the display means as a function of the electrical signals from the electrical test means, the digital computer means providing the initial count (J) to the input terminals of the presettable digital cylinder counter.

2. The engine test apparatus of claim 1 wherein the digital computer means monitors the digital cylinder count (Q) and determines a current cylinder number CYL NUM=J−Q+1.

3. The engine test apparatus of claim 1 and further comprising:

cylinder comparator means for comparing the digital cylinder count Q of the cylinder counter with a comparator count (N) and providing a comparator output signal when the digital cylinder count (Q) attains the comparator count (N);

wherein the electrical test means selectively derives the electrical signals at a time based upon occurrence of the comparator output signal; and wherein the digital computer means provides the comparator count (N) to the cylinder comparator means.

4. The engine test apparatus of claim 1 and further comprising:

means for providing a No. 1 pulse signal indicative of firing of a No. 1 cylinder of the engine; and wherein the reset means resets the cylinder counter to the initial count (J) in response to the No. 1 pulse signal.

5. The engine test apparatus of claim 1 and further comprising:

operator-controlled means for providing a disable signal to the cylinder counter to inhibit the cylinder counter from counting down in response to the cylinder clock signal.

6. An engine test apparatus for use in testing of a multi-cylinder internal combustion engine, the apparatus comprising:

cylinder clock means for deriving a cylinder clock signal representative of sequential operation of each cylinder of the engine, the cylinder clock signal exhibiting a predetermined signal transition for each cylinder;

a presettable digital cylinder counter for counting down in response to the predetermined signal transitions of the cylinder clock signal, the cylinder counter having output terminals for providing a digital cylinder count (Q) which is decremented with each predetermined signal transition, and input terminals for receiving an initial count (J) which is representative of the number of cylinders of the engine, and an output terminal which produces a first signal when the digital cylinder count (Q) reaches a cylinder predetermined digital count;

reset means for resetting the cylinder counter to the initial count (J) at the input terminals in response to the first signal;

means for comparing the digital cylinder count (Q) with a comparator count (N) and providing a second signal when the digital cylinder count (Q) attains the comparator count (N);

electrical test means for selectively deriving, from the engine, electrical signals indicative of operation of a system or component of the internal combustion engine based upon occurrence of the second signal;

operator input means for providing operator input signals indicative of a selected test to be performed;

display means for displaying visually a test result of the selected test performed;

means for controlling operation of the electrical test means as a function of the operator input signals;

means for controlling the display means as a function of the electrical signals from the electrical test means;

means for providing the initial count (J) to the input terminals of the cylinder counter; and means for providing the comparator count (N).

7. An engine test apparatus for use in testing of a multi-cylinder internal combustion engine, the apparatus comprising:

cylinder clock means for deriving a cylinder clock signal representative of sequential operation of each cylinder of the engine, the cylinder clock signal exhibiting a predetermined signal transition for each cylinder;

a presettable digital cylinder counter for counting down from an initial count (J) to zero in response to the predetermined signal transitions of the cylinder clock signal, the cylinder counter having output terminals for providing a digital cylinder count (Q) which is decremented with each predetermined signal transition, and input terminals for receiving the initial count (J) which is representative of the number of cylinders of the engine;

means for providing a No. 1 pulse signal indicative of firing of a No. 1 cylinder of the engine;

reset means for resetting the cylinder counter to the initial count (J) at the input terminals in response to the No. 1 pulse signal;

electrical test means for selectively deriving, from the engine, electrical signals indicative of operation of a system or component of the internal combustion engine;

operator input means for providing operator input signals indicative of a selected test to be performed;

display means for displaying visually a test result of the selected test performed; and digital computer means for controlling operation of the electrical test means as a function of the operator input signals and the digital cylinder count (Q) and for controlling the display means as a function of the electrical signals from the electrical test means, the digital computer means providing the initial count (J) to the input terminals of the presettable digital cylinder counter.

8. The engine test apparatus of claim 7 wherein the digital computer means monitors the digital cylinder count (Q) and determines a current cylinder number CYL NUM=J−Q+1.

9. The engine test apparatus of claim 7 and further comprising:

cylinder comparator means for comparing the digital cylinder count Q of the cylinder counter with a comparator count (N) and providing a comparator output signal when the digital cylinder count (Q) attains the comparator count (N);

wherein the electrical test means selectively derives the electrical signals at a time based upon occurrence of the comparator output signal; and wherein the digital computer means provides the comparator count (N) to the cylinder comparator means.

* * * * *